United States Patent
Liu et al.

(10) Patent No.: US 10,891,528 B1
(45) Date of Patent: *Jan. 12, 2021

(54) DEMODULATOR AND METHOD OF DEMODULATING ASK SIGNAL

(71) Applicant: Beken Corporation, Shanghai (CN)

(72) Inventors: Jiazhou Liu, Shanghai (CN); Cunliang Nai, Shanghai (CN)

(73) Assignee: Beken Corporation, Shanghai (CN)

( * ) Notice: Subject to any disclaimer, the term of this patent is extended or adjusted under 35 U.S.C. 154(b) by 8 days.

This patent is subject to a terminal disclaimer.

(21) Appl. No.: 16/525,355

(22) Filed: Jul. 29, 2019

(51) Int. Cl.
G06K 19/07 (2006.01)
G06K 19/077 (2006.01)
H04L 5/00 (2006.01)
H03H 7/01 (2006.01)

(52) U.S. Cl.
CPC ... G06K 19/0701 (2013.01); G06K 19/07773 (2013.01); H04L 5/0055 (2013.01); H03H 7/0138 (2013.01); H03H 7/0161 (2013.01)

(58) Field of Classification Search
CPC .............. G06K 7/10297; G06K 19/0723; H04L 27/06; H04L 27/08
See application file for complete search history.

(56) References Cited

U.S. PATENT DOCUMENTS

| | | | | |
|---|---|---|---|---|
| 6,176,432 B1 * | 1/2001 | Miyaura | ............ | G06K 19/0723 235/375 |
| 7,133,641 B2 * | 11/2006 | Ieki | .................... | G06K 19/0723 455/41.1 |
| 8,339,194 B2 * | 12/2012 | Liu | ......................... | H04L 27/06 329/369 |
| 8,693,582 B2 * | 4/2014 | Eliezer | ................... | G04R 20/10 375/320 |
| 8,928,400 B2 * | 1/2015 | Tsukamoto | ............. | H04L 27/06 329/347 |
| 9,515,702 B2 * | 12/2016 | Cho | ......................... | H03D 1/22 |
| 9,634,729 B2 * | 4/2017 | Kim | ........................ | H04L 27/06 |

* cited by examiner

*Primary Examiner* — Thien M Le
*Assistant Examiner* — April A Taylor
(74) *Attorney, Agent, or Firm* — Schwegman Lundberg & Woessner, P.A.

(57) ABSTRACT

A new demodulator with consistent sensibility to signals received from different directions, low power consumption, and low manufacturing cost is provided. The demodulator may include a first demodulator branch and a second demodulator branch electrically connected in parallel, and a DC circuit to provide DC power to the demodulator. The DC circuit has a first diode and a second diode electrically connected in series between a DC power supply Vcc and the ground. The second demodulator branch can share a low pass filter and a DC blocking capacitor of the first demodulator branch for example, and can multiplex or reuse a bias current from the first demodulator branch.

15 Claims, 4 Drawing Sheets

DEMODULATOR AND METHOD OF DEMODULATING ASK SIGNAL

TECHNICAL FIELD

The present application relates to a demodulation of an Amplitude Modulated (AM) signal, particularly to a demodulator, a method of demodulating an Amplitude Shift Keying (ASK) signal, and a Composite Password Card (CPC) including the demodulator.

BACKGROUND OF THE APPLICATION

ASK modulation is widely used in communication systems. For example, in an Electronic Toll Collection (ETC) system, a Road Side Unit (RSU) typically broadcasts ASK signals (such as a wake-up signal), and a demodulator in a Composite Password Card (CPC) carried by a vehicle typically receives and demodulates the ASK signals.

Conventionally, the demodulator may have inconsistent sensibility to ASK signals received from different directions, and may have high power consumption, which may affect life time of a disposable battery in the demodulator. Therefore, a new demodulator with consistent sensibility to ASK signals received from different directions and low power consumption becomes highly desirable.

BRIEF DESCRIPTION OF THE APPLICATION

According to an embodiment, a demodulator may comprise a first demodulator branch, a second demodulator branch, and a DC circuit. The first demodulator branch may comprise a first antenna, a first coupling capacitor, a first band pass filter, a low pass filter, and a DC blocking capacitor that are electrically connected in series, wherein the DC blocking capacitor is electrically connected to a load resistor. The second demodulator branch may comprise a second antenna, a second coupling capacitor, and a second band pass filter that are electrically connected in series. The DC circuit may comprise a DC power supply, a bias resistor, a first diode, a choke inductor, and a second diode that are electrically connected in series. An anode of the first diode is electrically connected to a first spot of the first demodulator branch, and an anode of the second diode is electrically connected to a second spot of the second demodulator branch.

According to an embodiment, a method for demodulating an ASK signal may comprise receiving the ASK signal with a demodulator, and demodulating the ASK signal with the demodulator. The demodulator may include a first demodulator branch, a second demodulator branch, and a DC circuit. The first demodulator branch may comprise a first antenna, a first coupling capacitor, a first band pass filter, a low pass filter, and a DC blocking capacitor electrically connected in series, wherein the DC blocking capacitor is electrically connected to a load resistor. The second demodulator branch may comprise a second antenna, a second coupling capacitor, a second band pass filter, and a second low pass filter electrically connected in series, wherein the second DC blocking capacitor is electrically connected to the load resistor. The DC circuit may comprise a DC power supply, a bias resistor, a first diode, a choke inductor, and a second diode electrically connected in series, wherein an anode of the first diode is electrically connected to a first spot in the first demodulator branch, and wherein an anode of the second diode is electrically connected to a second spot in the second demodulator branch.

According to an embodiment, a Composite Password Card (CPC) of an electronic toll collection system may comprise a demodulator configured to demodulate an ASK signal to obtain a base band signal, a wake-up circuit connected to the demodulator and configured to receive the base band signal, and a primary circuit connected to the wake-up circuit. The demodulator may comprise: a first demodulator branch comprising a first antenna, a first band pass filter, and a low pass filter electrically connected in series and connected to a load resistor; a second demodulator branch comprising a second antenna and a second band pass filter electrically connected in series; and a DC circuit comprising a DC power supply, a first diode, a choke inductor, and a second diode electrically connected in series. An anode of the first diode is electrically connected to a first spot in the first demodulator branch, and an anode of the second diode is electrically connected to a second spot in the second demodulator branch.

BRIEF DESCRIPTION OF THE DRAWINGS

Non-limiting and non-exhaustive embodiments of the present application are described with reference to the following figures, wherein like reference numerals refer to like parts throughout the various views unless otherwise specified.

DETAILED DESCRIPTION OF THE ILLUSTRATED EMBODIMENTS

Various aspects and examples of the application will now be described. The following description provides specific details for a thorough understanding and enabling description of these examples. Those skilled in the art will understand, however, that the application may be practiced without many of these details.

Additionally, some well-known structures or functions may not be shown or described in detail, so as concise purpose and to avoid unnecessarily obscuring the relevant description.

The terminology used in the description presented below is intended to be interpreted in its broadest reasonable manner, even though it is being used in conjunction with a detailed description of certain specific examples of the application. Certain terms may even be emphasized below, however, any terminology intended to be interpreted in any restricted manner will be overtly and specifically defined as such in this Detailed Description section.

Without loss of generality, reference will be made to illustrative embodiments by taking a demodulator and a method of demodulating an ASK signal in an ETC system as example. Those of ordinary skills in the art understand that this is only to describe the application clearly and adequately, rather than limit the scope of the application, which is defined by the appended claims.

Figure 1:
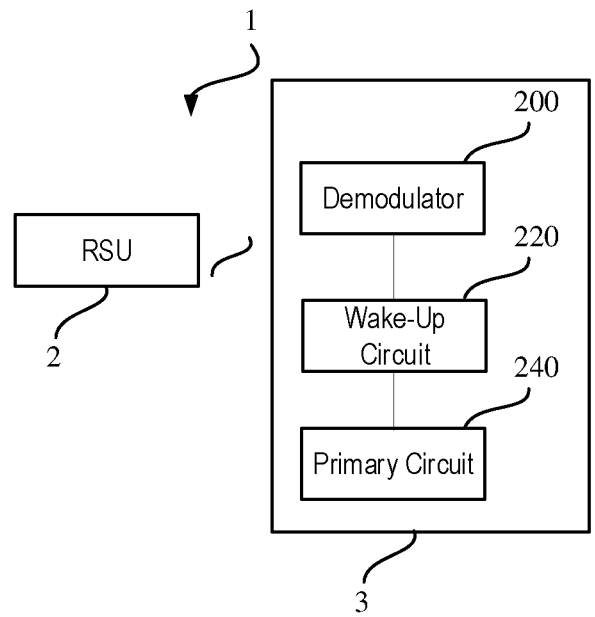
FIG. 1 is a block diagram illustrating an ETC system according to an embodiment of the application.

FIG. 1 shows a block diagram illustrating an ETC system 1 according to an embodiment. The ETC system 1 may comprise a Road Side Unit (RSU) 2 and a Composite Password Card (CPC) 3.

In practice, the RSU 2 may use a base band signal (e.g., with a frequency at 14 KHz) to change the amplitude of a carrier signal (e.g., with a frequency at 5.8 GHz) to obtain a resultant ASK signal, and may emit the resultant ASK signal to the CPC 3.

The CPC 3 may typically be installed inside a vehicle (not shown) on a windshield or at other suitable place of the vehicle for example. The CPC 3 may include a demodulator 200, a wake-up circuit 220 and a primary circuit 240 for example.

The demodulator 200 may receive and demodulate the resultant ASK signal to obtain the base band signal. The wake-up circuit 220 may detect a frequency of the base band signal for example. If the frequency meets at least one preset condition (e.g., the frequency falls within a defined frequency range), the wake-up circuit 220 may recognize that a wake-up signal has been received, and then may wake up the primary circuit 240 for example. The primary circuit 240 then may establish a connection with the RSU 2 to fulfill a payment for example.

Figure 2:
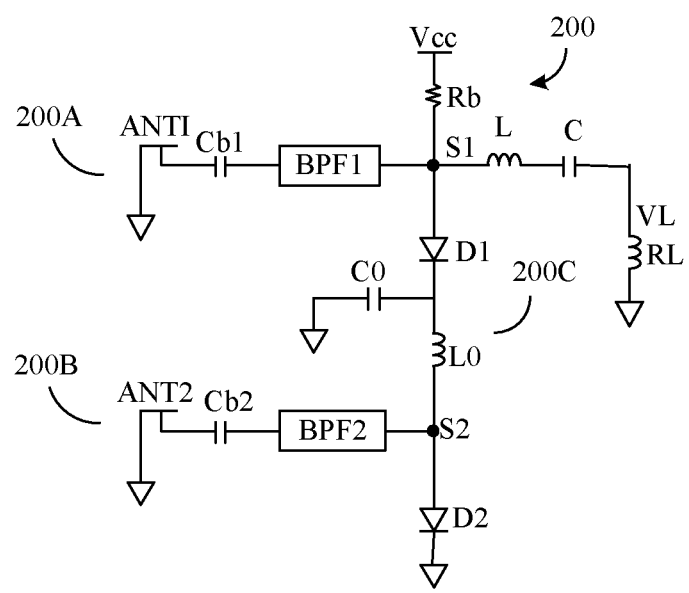
FIG. 2 is a circuit diagram illustrating a demodulator according to an embodiment of the application.

FIG. 2 shows a circuit diagram illustrating the demodulator 200 according to an embodiment of the application. The demodulator 200 may include a first demodulator branch 200A and a second demodulator branch 200B that are electrically connected in parallel, in general.

The first demodulator branch 200A is electrically connected between a first antenna ANT1 configured to receive an ASK signal and a load resistor RL. The load resistor RL is grounded.

The second demodulator branch 200B is electrically connected between a second antenna ANT2 configured to receive an ASK signal and the load resistor RL. The second demodulator 200B shares some elements of the first demodulator 200A as explained below.

In some embodiments, the first demodulator branch 200A may include: a first antenna ANT1 to receive an ASK signal, a first coupling capacitor Cb1, a first Band Pass Filter BPF1 to pass the ASK signal, a Low Pass Filter L to pass a demodulated signal, and a DC blocking capacitor C, which are all electrically connected in series.

The Low Pass Filter L includes an inductor. The DC blocking capacitor C is electrically connected to a first end of the load resistor RL. The second end of the load resistor RL is grounded. The RL can be an input resistance of an amplifier (not shown) in a following circuit (such as the wake-up circuit 220 as shown in FIG. 1) for example.

In some embodiments, the second demodulator branch 200B may include: a second antenna ANT2 to receive an ASK signal, a second coupling capacitor Cb2, and a second Band Pass Filter BPF2 to pass the ASK signal, which are all electrically connected in series. The second demodulator 200B may share the Low Pass Filter L and the DC blocking capacitor C of the first demodulator 200A.

The demodulator 200 further includes a DC circuit 200C. The DC circuit 200C may include a DC power supply Vcc, a bias (and blocking) resistor Rb, a first diode D1, a choke inductor L0, and a second diode D2, which are all electrically connected in series. The first diode D1 and the second diode D2 can be Schottky Barrier Diodes for example.

During operation, the Vcc supplies DC power at an end of the DC circuit 200C. At the other end of the DC circuit 200C, the cathode of the second diode D2 is grounded. In the DC circuit 200C, the first diode D1 and the second diode D2 are arranged in an electrical direction from the Vcc to the ground.

The anode of the first diode D1 is electrically connected to a first spot S1 of the first demodulator branch 200A, which is electrically connected to both the first Band Pass Filter BPF1 and the Low Pass Filter L of the first demodulator branch 200A. The anode of the second diode D2 is electrically connected to a second spot S2 of the second demodulator branch 200B, which is electrically connected to both the second Band Pass Filter BPF2 of the second demodulator branch 200B and the choke inductor L0 of the DC circuit 200C.

Thereby, the first diode D1 and the choke inductor L0 of the DC circuit 200C are electrically connected in series between the first spot S1 of the first demodulator branch 200A and the second spot S2 of the second demodulator branch 200B.

The DC circuit 200C may further include a bypass capacitor C0 with a small capacitance (such as 10 pF) for example. The cathode of the first diode D1 is grounded via the bypass capacitor C0 to bypass an ASK modulated signal (e.g., at a frequency of 5.8 GHz).

FIGS. 3A-3E are drawings illustrating routes of various signals according to an embodiment of the application.

Figure 3A:
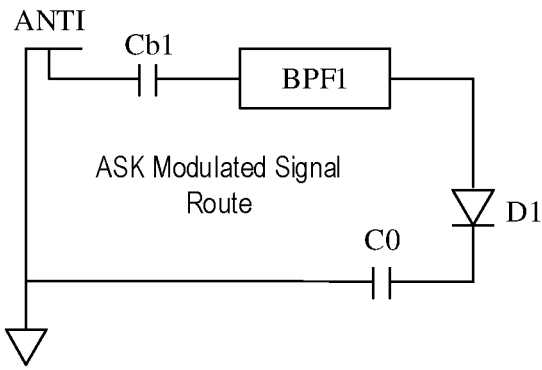
FIGS. 3A-3E are drawings illustrating routes of various signals according to an embodiment of the application.

FIG. 3A shows a modulated signal route in the first demodulator branch 200A. For example, a modulated signal can be an ASK modulated signal at a Radio Frequency (RF) of 5.8 GHz that is received by the first antenna ANT1 of the first demodulator branch 200A.

Figure 3B:
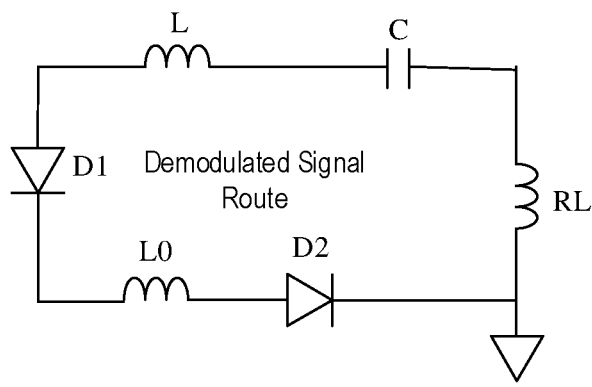

FIG. 3B shows a demodulated signal route in the first demodulator branch 200A. For example, the demodulated signal can be a base band signal at a video frequency of 14 KHz. The demodulated signal in the first demodulator branch 200A passes through both the first diode D1 and the second diode D2 of the DC circuit 200C and then is grounded. The demodulated signal in the first demodulator branch 200A may flow through the Low Pass Filter L and the DC blocking capacitor C of the first demodulator branch 200A, and then may input to the load resistor RL.

Figure 3C:
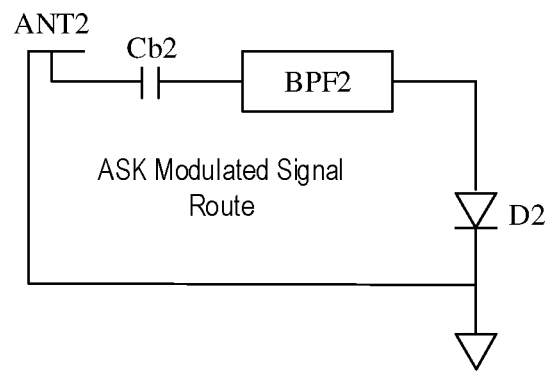

FIG. 3C shows a modulated signal route in the second demodulator branch 200B. For example, the modulated signal can be an ASK modulated signal at a Radio Frequency (RF) of 5.8 GHz that is received by the second antenna ANT2 of the second demodulator branch 200B.

Figure 3D:
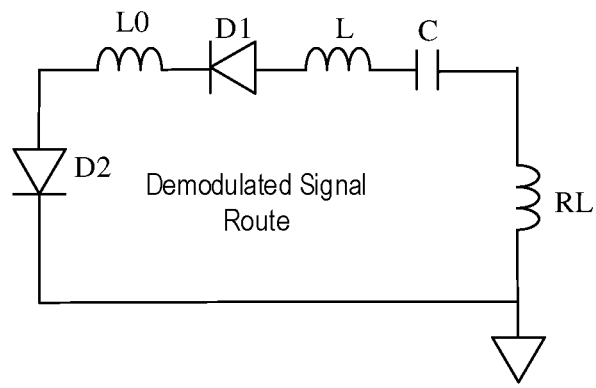

FIG. 3D shows a demodulated signal route in the second demodulator branch 200B. For example, the demodulated signal can be a base band signal at a video frequency of 14 KHz. The demodulated signal in the second demodulator branch 200B passes through the second diode D2 of the DC circuit 200C. The demodulated signal in the second demodulator branch 200B may flow through the Low Pass Filter L and the DC blocking capacitor C of the first demodulator branch 200A, and then may input to the load resistor RL.

As shown in FIGS. 3B and 3D, the demodulated signal in the first demodulator branch 200A and the demodulated signal in the second demodulator branch 200B may share the Low Pass Filter L and the DC blocking capacitor C of the first demodulator branch 200A as a common signal path to the load resistor RL.

Figure 3E:
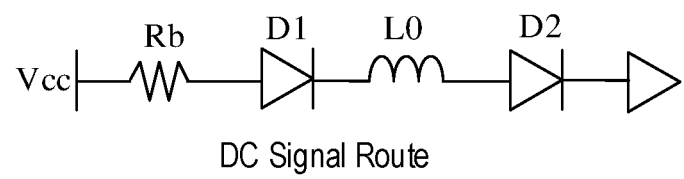

FIG. 3E shows a DC current route in the DC circuit 200C. During operation, the DC current supplied from the Vcc flows through the bias resistor Rb, the first diode D1, the choke inductor L0, and a second diode D2, and finally into the ground.

An example is provided below to illustrate how the demodulator 200 as shown in FIG. 2 works. For example, those elements as shown in FIG. 2 may have exemplary values, Cb1=Cb2=10 pF, Rb=600 Kohm, C0=10 pF, C=100 nF, L=100 nH, L0=100 nH, etc.

As shown in FIG. 2, since the first demodulator branch 200A has the first coupling capacitor Cb1 and the DC blocking capacitor C to block DC current, the DC current supplied from the Vcc in the DC circuit 200C may not flow into the first demodulator branch 200A at the first spot S1.

Since the second demodulator branch 200B has the second coupling capacitor Cb2 to block DC current, the DC current that is supplied from the Vcc in the DC circuit 200C, and passes through the first diode D1 and the choke inductor L0, may not flow into the second demodulator branch 200B at the second spot S2.

In some embodiments, the cathode of the first diode D1 is connected the anode of the second diode D2 via the choke inductor L0. The cathode of the second diode D2 is grounded. The choke inductor L0 (e.g., with inductance 100 nH) in the DC circuit 200C may block RF signals (e.g., modulated signals at frequency of 5.8 GHz). Thus, the choke inductor L0 may prevent RF signals from cross-entering between the first demodulator branch 200A and the second demodulator branch 200B, and may also prevent RF signals from entering into the DC circuit 200C from the second demodulator branch 200B.

In some embodiments, the bypass capacitor C0 with a small capacitance (e.g., about 10 pF) is used in the DC circuit 200C to bypass the demodulated signals (such as 5.8 GHz RF signals) to the ground. The bias resistor Rb in the DC circuit 200C by itself may function as a bias resistor.

With the dual antenna structure of the demodulator as described above, the demodulator has a more consistent sensibility for signals received from different directions. Since the second demodulator branch can multiplex or reuse a bias current supplied from the DC power supply Vcc for the first demodulator branch, the DC power consumption of the demodulator can be greatly reduced.

Additionally, since the second demodulator branch can share some common elements (such as the Low Pass Filter and the DC blocking capacitor) of the first demodulator, the cross-entering of the demodulated signals between the first demodulator branch and the second demodulator branch can be prevented, and the manufacturing cost of the demodulator can be deduced since less elements are used.

Figure 4A:
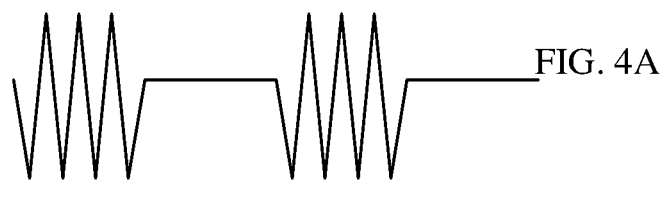
FIGS. 4A-4B are drawings illustrating wave forms of signals according to an embodiment of the application.
Figure 4B:
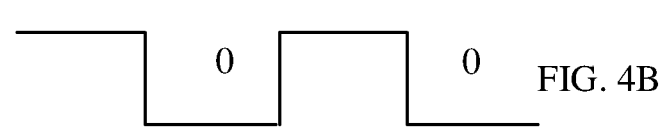

FIGS. 4A-4B illustrate wave forms of signals according to an embodiment of the application. FIG. 4A shows a wave form of an ASK modulated signal (at a radio frequency of e.g., 5.8 GHz) received by the first antenna of the first demodulator branch, for example. FIG. 4B shows a wave form of a demodulated signal (at a frequency of e.g., 14 KHz) in the first demodulator branch 200A, for example.

Figure 5:
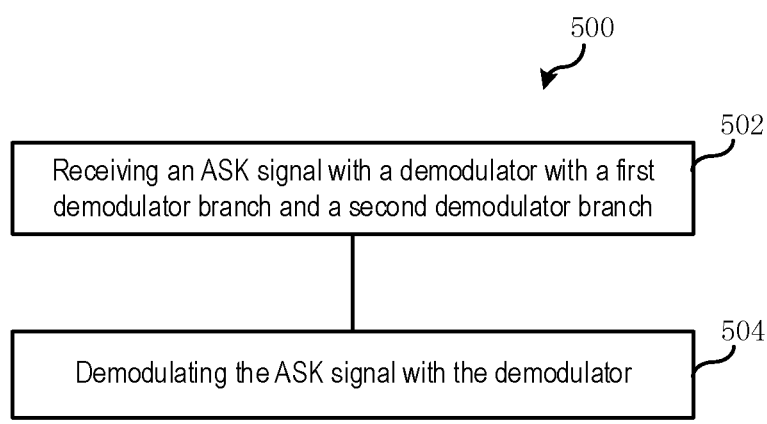
FIG. 5 is a flow chart illustrating a method of demodulating an ASK signal according to an embodiment of the application.

FIG. 5 is a flow chart illustrating a method 500 of demodulating an ASK signal according to an embodiment of the application. In an embodiment of the application, in step 502, receiving the ASK modulated signal with a demodulator 200 as shown in FIG. 2, in step 504, demodulating the ASK modulated signal with the demodulator 200 to obtain a demodulated signal or a base band signal as discussed above.

Those of ordinary skill in the art understand that the wave form of signal 332 is shown as linear to illustrate the change of wave forms more clearly, rather than to limit the scope of the present application.

Features and aspects of various embodiments may be integrated into other embodiments, and embodiments illustrated in this document may be implemented without all of the features or aspects illustrated or described.

One skilled in the art will appreciate that although specific examples and embodiments of the system and methods have been described for purposes of illustration, various modifications can be made without deviating from the spirit and scope of the present application. Moreover, features of one embodiment may be incorporated into other embodiments, even where those features are not described together in a single embodiment within the present document. Accordingly, the application is described by the appended claims.

What is claimed is:

1. A demodulator comprising:
a first demodulator branch comprising:
a first antenna, a first coupling capacitor, a first band pass filter, a low pass filter, and a DC blocking capacitor that are electrically connected in series, wherein the DC blocking capacitor is electrically connected to a load resistor;
a second demodulator branch comprising: a second antenna, a second coupling capacitor, and a second band pass filter that are electrically connected in series; and
a DC circuit comprising: a DC power supply, a bias resistor, a first diode, a choke inductor, and a second diode that are electrically connected in series; wherein an anode of the first diode is electrically connected to a first spot of the first demodulator branch, and wherein an anode of the second diode is electrically connected to a second spot of the second demodulator branch.

2. The demodulator of claim 1, wherein the DC circuit further comprises a bypass capacitor that is grounded.

3. The demodulator of claim 1, wherein the first spot of the first demodulator is electrically connected to the first band pass filter and the low pass filter, and wherein the second spot of the second demodulator is electrically connected to the second band pass filter and the choke inductor.

4. The demodulator of claim 1, wherein the low pass filter comprises a low pass inductor.

5. The demodulator of claim 1, wherein the load resistor is grounded, and wherein a cathode of the second diode is grounded.

6. A method for demodulating an Amplitude Shift Keying (ASK) signal, comprising:
receiving the ASK signal with a demodulator, the demodulator including:
a first demodulator branch comprising: a first antenna, a first coupling capacitor, a first band pass filter, a low pass filter, and a DC blocking capacitor electrically connected in series, wherein the DC blocking capacitor is electrically connected to a load resistor;
a second demodulator branch comprising: a second antenna, a second coupling capacitor, a second band pass filter, and a second low pass filter electrically connected in series, wherein the second DC blocking capacitor is electrically connected to the load resistor; and
a DC circuit comprising: a DC power supply, a bias resistor, a first diode, a choke inductor, and a second diode electrically connected in series, wherein an anode of the first diode is electrically connected to a first spot in the first demodulator branch, and wherein an anode of the second diode is electrically connected to a second spot in the second demodulator branch; and
demodulating the ASK signal with the demodulator.

7. The method of claim 6, wherein the DC circuit further comprises a bypass capacitor configured to bypass a modulated signal passing through the first diode.

8. The method of claim 6, wherein the first spot in the first demodulator is electrically connected between the first band pass filter and the low pass filter, and wherein the second spot in the second demodulator is electrically connected to the second band pass filter and the choke inductor.

9. The method of claim 6, wherein the load resistor is grounded, and wherein a cathode of the second diode is grounded.

10. A Composite Password Card (CPC) of an electronic toll collection system, comprising:
 a demodulator configured to demodulate an Amplitude Shift Keying (ASK) signal to obtain a base band signal;
 a wake-up circuit connected to the demodulator and configured to receive the base band signal; and
 a primary circuit connected to the wake-up circuit;
 wherein the demodulator comprises:
 a first demodulator branch comprising: a first antenna, a first band pass filter, and a low pass filter electrically connected in series, and connected to a load resistor;
 a second demodulator branch comprising:
 a second antenna and a second band pass filter electrically connected in series; and
 a DC circuit comprising: a DC power supply, a first diode, a choke inductor, and a second diode electrically connected in series, wherein an anode of the first diode is electrically connected to a first spot in the first demodulator branch, and wherein an anode of the second diode is electrically connected to a second spot in the second demodulator branch.

11. The CPC of claim 10, wherein the first spot in the first demodulator is electrically connected to the first band pass filter and the first low pass filter, and wherein the second spot in the second demodulator is electrically connected to the second band pass filter and the choke inductor.

12. The CPC of claim 10, wherein the DC circuit further comprises a bias resistor electrically connected in series between the DC power supply and the first diode.

13. The CPC of claim 10, wherein the load resistor comprises an input resistor of an amplifier of the wake-up circuit.

14. The CPC of claim 10, wherein the first demodulator branch further comprises a first coupling capacitor that is electrically connected in series between the first antenna and the first band pass filter.

15. The CPC of claim 10, wherein the second demodulator branch further comprises a second coupling capacitor that is electrically connected in series between the second antenna and the second band pass filter.

* * * * *